(12) United States Patent
Wang et al.

(10) Patent No.: US 6,998,833 B2
(45) Date of Patent: Feb. 14, 2006

(54) SYSTEM AND METHOD FOR DETERMINING S-PARAMETERS USING A LOAD

(75) Inventors: Yong Wang, Fort Collins, CO (US); Karl Bois, Fort Collins, CO (US); David W. Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 19 days.

(21) Appl. No.: 10/701,907

(22) Filed: Nov. 5, 2003

(65) Prior Publication Data

US 2005/0093554 A1    May 5, 2005

(51) Int. Cl.
*G01R 23/16*    (2006.01)
(52) U.S. Cl. .................. 324/76.12; 324/612; 324/638; 702/117
(58) Field of Classification Search ............... 324/601, 324/629, 633, 637, 638, 642, 646, 650; 702/85, 702/86, 104, 117
See application file for complete search history.

(56) References Cited

U.S. PATENT DOCUMENTS

| 4,497,030 | A |  | 1/1985 | Bowling et al. |
| 4,775,845 | A | * | 10/1988 | McCoy ........................ 331/96 |
| 5,321,364 | A |  | 6/1994 | Nukiyama et al. ........... 324/601 |
| 5,548,221 | A |  | 8/1996 | Adamian et al. |
| 5,548,538 | A |  | 8/1996 | Grace et al. |
| 5,552,714 | A | * | 9/1996 | Adamian et al. ........... 324/601 |
| 5,578,932 | A |  | 11/1996 | Adamian |
| 6,147,501 | A |  | 11/2000 | Chodora ..................... 324/601 |
| 6,300,775 | B1 | * | 10/2001 | Peach et al. ................. 324/601 |
| 6,594,604 | B1 |  | 7/2003 | Metzger et al. ............. 702/104 |
| 6,836,743 | B1 |  | 12/2004 | Blackham et al. |
| 2003/0115008 | A1 | * | 6/2003 | Doi ............................. 702/117 |

OTHER PUBLICATIONS

Vector Network Analyzers R&S ZVB (http://www.rohde-schwarz.com/www/dev_center.nsf/html/zvb).*

* cited by examiner

*Primary Examiner*—Vincent Q. Nguyen

(57) ABSTRACT

A system and method can be utilized to determine S-parameters of a network. In one embodiment a system includes an S-parameter calculator that computes the S-parameters of the network based on waveform parameters determined from single port measurements. At least one of the single port measurements corresponds to measurements at one of the plural ports while a matched load is applied to at least another of the plural ports.

30 Claims, 5 Drawing Sheets

SYSTEM AND METHOD FOR DETERMINING S-PARAMETERS USING A LOAD

RELATED APPLICATION

This application is related to co-pending and commonly assigned U.S. patent application to Yang et al., which was filed contemporaneously with this application and entitled "SYSTEM AND METHOD FOR DETERMINING S-PARAMETERS," 10/701,864, the disclosure of which is incorporated herein by reference.

BACKGROUND

Electronic networks, such as integrated circuits (ICs), are employed to perform a variety of electronic functions, such as filtering microwave or radio frequency signals. In evaluating the performance of a particular network, it may be desirable to measure its electrical accuracy. One manner by which the electrical accuracy of a network can be measured is by determining the scattering parameters (S-parameters) of the network. The S-parameters of a network are indicative of the degree of signal transmission and reflection at the ports of the network.

Typically, to determine the S-parameters of a network, an analysis tool, such as a network analyzer, is used to measure waveform parameters simultaneously at the input and output ports of the network. For example, to measure the waveform parameters at the ports of the network, probes can be utilized to establish electrical contact between the ports and the network analyzer. Establishing electrical contact with probes, however, can be problematic in that the ports of the network may be electrically conductive pads that may be extremely small, such as having a pitch of 250 microns or less. This issue can become compounded in a network having pads located on opposite surfaces of an IC die, package substrate or printed circuit board. Accordingly, to establish a clean and reliable connection with the pads usually requires a high degree of precision.

SUMMARY

One embodiment of the present invention may comprise a system that includes an S-parameter calculator that computes the S-parameters of the network based on waveform parameters determined from single port measurements. At least one of the single port measurements corresponds to measurements at one of the plural ports while a matched load is applied to at least another of the plural ports.

Another embodiment of the present invention may comprise a system that includes a reflection coefficient engine that determines a subset of 2n–1 reflection coefficients associated with ports of the multi-port network. The subset of reflection coefficients may be selected according to what types of measurements are performed at the ports of the multi-port network At least one of the types of measurements corresponds to a measurement at one of the n ports while a matched load is employed at at least another of the n ports. An S-parameter calculator computes the S-parameters for the n-port network based on the subset of reflection coefficients.

Yet another embodiment of the present invention may comprise a method that includes determining waveform parameters based on single port measurements performed at plural ports of the network. At least one of the single port measurements corresponding to measurements at one of the plural ports while a matched load is applied to at least another of the plural ports. S-parameters of the network are determined based on the waveform parameters.

Still another embodiment of the present invention may comprise a computer-readable medium having computer-executable instructions for receiving waveform parameters based on single port measurements performed at plural ports of the network, at least one of the single port measurements corresponding to measurements at one of the plural ports while a matched load is applied to at least another of the plural ports, and determining S-parameters of the network based on the waveform parameters.

Another embodiment of the present invention may comprise a computer-readable medium having computer-executable instructions for determining reflection coefficients based on single port measurements performed at plural ports of the network, at least one of the single port measurements corresponding to measurements at one of the plural ports while a match load is applied to at least another of the plural port, and determining S-parameters of the network based on the reflection coefficients.

DETAILED DESCRIPTION

This disclosure relates generally to a system and method for determining S-parameters for an electronic network, which can have two or more ports. A set of reflection coefficients may be derived for the network based on waveform parameters. The waveform parameters, for example, can be measured by a network analyzer or other test equipment using single port measurements. The S-parameters of the network can be determined from a subset of the reflection coefficients. According to one embodiment of the present invention, the S-parameters can be determined based on single port measurements of the network, at least one of which measurements implemented while a matched load is connected at the other port(s).

Figure 1:
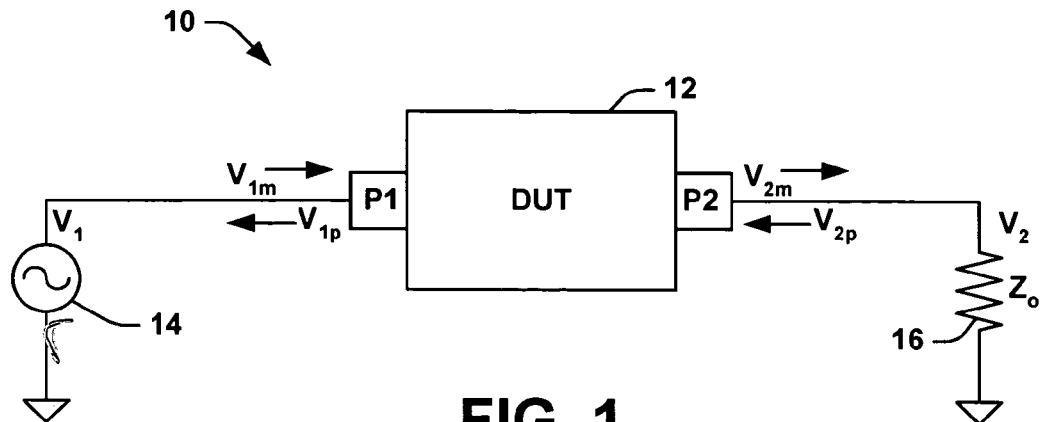
FIG. 1 depicts a simplified block diagram of a circuit including a network.

FIG. 1 illustrates a circuit 10 including a device under test (DUT) 12. In the example of FIG. 1, the DUT 12 is assumed to be a passive two-port electronic network. As such, the DUT 12 can be characterized by four S-parameters $S_{11}$, $S_{12}$, $S_{21}$, and $S_{22}$. The S-parameters can be determined based on reflection coefficients F determined for the DUT 12, which coefficients define a relationship between transmission and reflection of signals at a port. Reflection coefficients for the DUT 12 can be determined based on single port measurements of waveform parameters of the DUT. For example, the waveform parameters can be measured at a particular single port, such as when the other port(s) are left open, are shorted or a matched load is applied thereto. The single port measurements are particularly useful when the ports may be located on substantially opposing surfaces of the DUT 12, such as opposite sides of an IC die, package substrate or printed circuit board. The reflection coefficients may then be used to determine the S-parameters of the DUT 12, such as by reconstructing an S-parameter matrix (or model) that characterizes the DUT.

In characterizing the DUT 12, the $S_{11}$, parameter is related to signal reflection at the input port P1, which varies as a function of the input impedance of the DUT, and models how the DUT reflects the input signal $V_1$. The $S_{22}$ parameter of the DUT 12 is related to signal reflection at the output port P2, which is a function of the output impedance of the DUT in relation to the impedance of the load $Z_0$, and models signal reflection at the output port P2. The $S_{12}$ parameter models the reverse gain of the DUT 12. The $S_{21}$ parameter represents the insertion or forward gain of the DUT 12.

To illustrate operation of the circuit 10, a source 14 supplies an input signal (e.g., a sine wave at a desired frequency) having a voltage $V_1$ to an input port P1 of the DUT 12. An output port P2 of the DUT 12 provides an output signal $V_2$ based on the input signal $V_1$. In the example of FIG. 1, the DUT 12 provides the output signal $V_2$ to a load 16 having a characteristic impedance $Z_0$, such as about 50 ohms.

Waveform parameters (e.g., amplitude or voltage) of the DUT 12 can be measured at the input port P1 and at the output port P2. The waveform parameters include the transmitted portion $V_{1m}$ of the input signal $V_1$, i.e., the portion of the input signal $V_1$ transmitted to the DUT 12 from the source 14. The waveform parameters also include the reflected portion $V_{1p}$ of the input signal $V_1$, i.e., the portion of the input signal $V_1$ reflected back toward the source 14 from the DUT. The waveform parameters can also include the transmitted portion $V_{2m}$ of the output signal $V_2$, i.e., the portion of the output signal $V_2$ transmitted to the load $Z_0$ from the DUT 12, and the reflected portion $V_{2p}$ of the output signal $V_2$, i.e., the portion of the output signal reflected back toward the DUT from the load $Z_0$.

The amplitude of $V_{1p}$ depends on the amount of mismatch between the output impedance of the source 14 and the input impedance of the DUT 12. The amplitude of $V_{1p}$ increases according to the mismatch between the output impedance of the source 14 and the input impedance of the DUT 12. If the input impedance of the DUT 12 and the output impedance of the source 14 are matched and the output impedance and the load $Z_0$ are matched, for example, there will be no reflection of the input signal $V_1$, namely, $V_{1p}=0$ and $V_{1m}=V_1/2$, assuming the source has a 50 Ohm series resistance.

Similarly, the amplitude of $V_{2p}$ depends on the amount of mismatch between the output impedance of the DUT 12 and the impedance of the load $Z_0$. The amplitude of $V_{2p}$ increases with the mismatch between the output impedance of the DUT 12 and the impedance of the load $Z_0$. If the impedance of the load $Z_0$ and the output impedance of the DUT 12 are matched and the input impedance and the output impedance of the source 14 are matched, there will be no reflection of the output signal $V_2$, namely, $V_{2p}=0$ and $V_{2m}=V_2/2$, assuming the source has a 50 Ohm series resistance.

The S-parameters of the DUT 12 are related to voltage waveform parameters $V_{1m}$, $V_{1p}$, $V_{2m}$, and $V_{2p}$. For the example of a two port network, the S-parameter matrix can be expressed as follows:

$$\begin{pmatrix} V_{1m} \\ V_{2m} \end{pmatrix} = \begin{pmatrix} S_{11} & S_{12} \\ S_{21} & S_{22} \end{pmatrix} \cdot \begin{pmatrix} V_{1p} \\ V_{2p} \end{pmatrix} \qquad \text{Eq. 1}$$

According to one embodiment, reflection coefficients Γ for the DUT 12 can be determined through single port measurements of waveform parameters of the DUT. The reflection coefficients may then be used to determine the S-parameters of the DUT 12 and reconstruct the S-parameter matrix of Eq. 1. As mentioned above, the waveform parameters are measured at one particular port, such as while the other port(s) are left open, are shorted or a matched load is applied at such other port(s). The corresponding S-parameters can then be derived based on the measurements.

As described below, for the example of a two port network, the entire S-parameter matrix can be reconstructed from three single port measurements. In one embodiment, at least one measurement is taken at one port while a matched load is connected at the other port. A matched load has an impedance that matches the impedance of the port to which it is connected. The accuracy of the S-parameters will improve as the load is more accurately matched to the port impedance. The following sets forth an example derivation of equations that can be employed to determine the reflection coefficients and the S-parameters through single port measurements.

By way of example, a first scenario, described below, corresponds to a situation where one measurement is taken at port P1 while port P2 is a matched load and another measurement is taken at P1 while port P2 is open. A third measurement is taken at port P2 while a matched load is connected at port P1. Thus, if a matched load is applied at the output port P2 during measurements at port P1:

$$\Gamma_{2match} = \frac{V_{1m}}{V_{1p}} = S_{11} \qquad \text{Eq. 2}$$

If the output port P2 is left open:

$$V_{2m}=V_{2p} \qquad \text{Eq. 3}$$

This being the case, the S-parameter matrix of Eq. 1 may be reduced to the following:

$$V_{1m}=S_{11} \cdot V_{1p}+S_{12} \cdot V_{2p} \qquad \text{Eq. 4}$$

$$V_{2p}=S_{21} \cdot V_{1p}+S_{22} \cdot V_{2p} \qquad \text{Eq. 5}$$

$V_{2p}$ may be solved as a function of $V_{1p}$ and Eq. 5 can be rewritten as follows:

$$V_{2p} = S_{21} \cdot \frac{V_{1p}}{1-S_{22}} \qquad \text{Eq. 6}$$

Eq. 6 can be substituted in Eq. 4, and Eq. 4 can be rewritten as follows:

$$V_{1m} = S_{11} \cdot V_{1p} + S_{12} \cdot S_{21} \cdot \frac{V_{1p}}{1-S_{22}} \qquad \text{Eq. 7}$$

Eq. 7 can be rewritten to express a reflection coefficient ($\Gamma_{2open}$) that represents a ratio of transmission to reflection for the open condition of the output port P2 as follows:

$$\frac{V_{1m}}{V_{1p}} = \Gamma_{2open} = S_{11} + \frac{S_{12} \cdot S_{21}}{(1 - S_{22})} \quad \text{Eq. 8}$$

If a matched load is applied at the input port P1 during measurements at port P2:

$$\Gamma_{1match} = \frac{V_{2m}}{V_{2p}} = S_{22} \quad \text{Eq. 9}$$

This being the case, Eq. 3 and 9 can be substituted into Eq. 8 and, due to symmetry, the following is obtained:

$$S_{12} = S_{21} = \sqrt{(\Gamma_{2open} - \Gamma_{2match}) \cdot (1 - \Gamma_{1match})} \quad \text{Eq. 10}$$

The remaining S-parameters are as follows:

$$S_{11} = \Gamma_{2match} \quad \text{Eq. 11}$$

$$S_{22} = \Gamma_{1match} \quad \text{Eq. 12}$$

By way of further example, a second scenario corresponds to a situation where one measurement is taken at port P1 while port P2 is a matched load and another measurement is taken at P1 while port P2 is shorted. A third measurement is taken at port P2 while a matched load is connected at port P1. That is, if the output port P2 is shorted, the following condition exists $$V_{2m} = -V_{2p} \quad \text{Eq. 13}$$

This being the case, the S-parameter matrix of Eq. 1 may be reduced to the following:

$$V_{1m} = S_{11} \cdot V_{1p} + S_{12} \cdot V_{2p} \quad \text{Eq. 14}$$

$$-V_{2p} = S_{21} \cdot V_{1p} + S_{22} \cdot V_{2p} \quad \text{Eq. 15}$$

$V_{2p}$ may be solved as a function of $V_{1p}$ and Eq. 15 can be rewritten as follows:

$$V_{2p} = -S_{21} \cdot \frac{V_{1p}}{1 + S_{22}} \quad \text{Eq. 16}$$

Eq. 16 can be substituted in Eq. 14 and Eq. 14 can be rewritten as follows:

$$V_{1m} = S_{11} \cdot V_{1p} - S_{12} \cdot S_{21} \cdot \frac{V_{1p}}{1 + S_{22}} \quad \text{Eq. 17}$$

Eq. 17 can be rewritten to express a reflection coefficient ($\Gamma_{2short}$) that represents a ratio of transmission to reflection for the shorted condition of the output port P2 as follows:

$$\frac{V_{1m}}{V_{1p}} = \Gamma_{2short} = S_{11} - \frac{S_{12} \cdot S_{21}}{(1 + S_{22})} \quad \text{Eq. 18}$$

Referring back to Eq. 9, above, if a matched load is applied at the input port P1 during measurements at port P2, the following conditions exists:

$$\Gamma_{1match} = S_{22}. \quad \text{Eq. 19}$$

This being the case, Eq. 13 and 9 can be substituted into Eq. 18 and, due to symmetry, the following is obtained:

$$S_{12} = S_{21} = \sqrt{(\Gamma_{2match} - \Gamma_{2short}) \cdot (1 + \Gamma_{1match})} \quad \text{Eq. 20}$$

The remaining S-parameters, $S_{11}$ and $S_{22}$ remain as represented in Eqs. 11 and 12.

The equations describing the DUT 12 simplify since the DUT in the example of FIG. 1 is assumed to be a passive device. By "passive," it is meant that the network adds substantially no gain to the input signal $V_1$ and, therefore, $S_{12} = S_{21}$. Further simplifications in the equations exist since matched loads are employed at ports P1 and P2 during respective measurements. The simplified equations further mitigate errors from propagating through the results, thereby enhancing the accuracy of the resulting S-parameters.

FIGS. 2–5 illustrate example configurations of a system 20 that can be utilized to determine S-parameters using single port measurements. The system 20 is operative to measure waveform parameters at a single port, such as at the input port P1 or at the output port P2.

Figure 2:
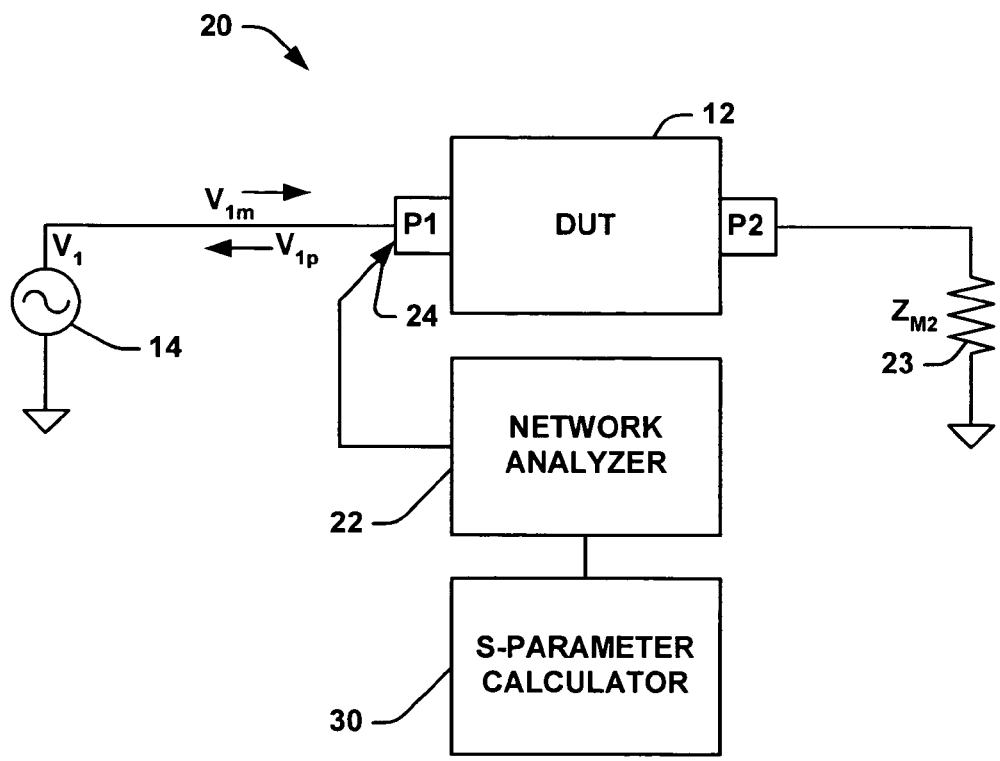
FIG. 2 depicts a simplified block diagram of one embodiment of a system in a first configuration for use in determining S-parameters of a network.

A measurement device, such as a network analyzer 22 is electrically connected with the input port P1 of the DUT 12 by an electrical connection means, such as a probe, schematically indicated at 24. Those skilled in the art will appreciate that various types and configurations of probes exist, and that any such probe can be employed, such depending on the type and configuration of the DUT 12. The source 14 could be separate from the network analyzer 22, as shown in FIG. 2, or it could be integrated with or otherwise included in the network analyzer. As mentioned above, measurements typically are taken at ports P1 and P2 simultaneously with a pair of probes. Alignment of the probes at such ports generally requires a high degree of precision. By employing the single port measurements, as described herein, to determine S-parameters, the physical measurements with the probe 24 can be facilitated (e.g., using less complicated and inexpensive equipment) since separate measurements can be made at the ports P1 and P2, such as with one or more probes.

An S-parameter calculator 30 is operatively associated with the network analyzer 22. The S-parameter calculator 30 is programmed and/or configured to ascertain S-parameters for the DUT 12 based on a subset of possible reflection coefficients derived from single port measurements at ports P1 and P2. For example, the S-parameter calculator 30 can compute the S-parameters by implementing selected equations (e.g., as listed above) based on values measured or otherwise obtained by the network analyzer 22.

The calculator 30 can be implemented as computer executable instructions within the network analyzer 22 or in an associated computer or analysis tool. The S-parameter calculator 30, for example, may take the form of a host computer, such as a PC, or a portion of the network analyzer dedicated to performing S-parameter calculations based on the measured values. Additionally, the S-parameter calculator 30 could even be embodied as manual calculations of the S-parameters based on the values measured by the network analyzer 22.

In the particular configuration of the system 20 shown in FIG. 2, the DUT 12 is operatively connected with the source 14, which supplies an input signal $V_1$ to the input port P1 of the DUT. A matched load 23 having an impedance indicated at $Z_{M1}$ is connected at the output port P2. The matched load $Z_{M1}$ has an impedance set equal to the impedance of the DUT at the output port P2. For example, if the impedance of the DUT at the output port P2 is 50 Ohms, the impedance of the matched load $Z_{M1}$ is 50 Ohms. The accuracy of the resulting S-parameters can be improved by employing better matching impedance at the non-measured ports. In this configuration, the network analyzer 22 can measure $V_{1m}$ and $V_{1p}$ at the input port P1 via the probe 24. The S-parameter calculator 30 can determine the reflection coefficient $\Gamma_{2open}$ (e.g., via implementation of Eq. 2) based on $V_{1m}$ and $V_{1p}$ determined from the single port measurement at port P1 while the matched load $Z_{M1}$ is applied to the output port P2.

Figure 3:
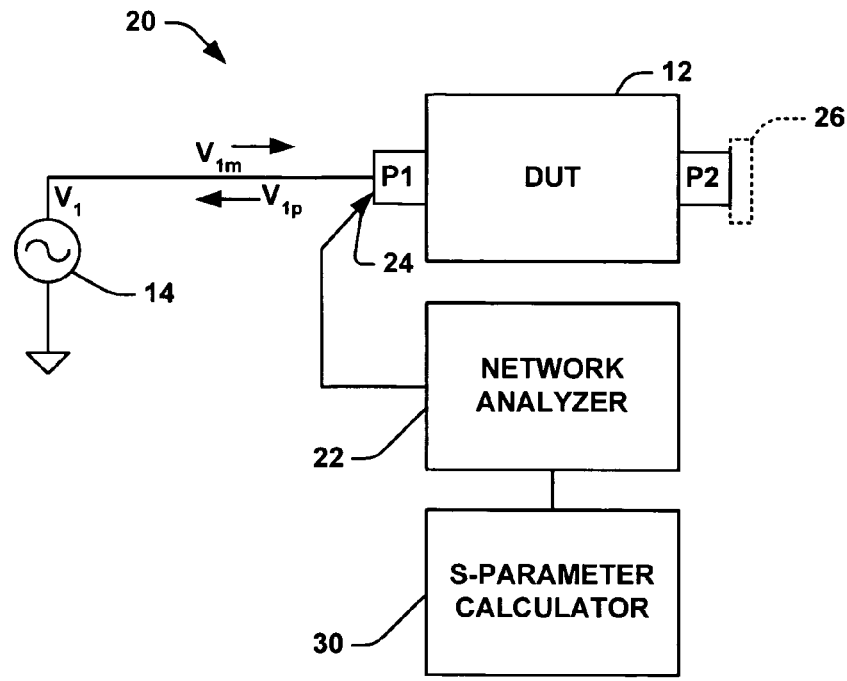
FIG. 3 depicts a simplified block diagram of the system of FIG. 2 in a second configuration for use in determining S-parameters of a network.

The system 20 of FIG. 2 can be re-configured as shown in FIG. 3, which can be employed to obtain measurement when the output port P2 is open or shorted. For the example where the output port P2 is open, it is shown above that $V_{2m}=V_{2p}$. When the output port P2 is open, the network analyzer 22 can measure $V_{1m}$ and $V_{1p}$ at the input port P1 via the probe 24. The S-parameter calculator 30 can determine the reflection coefficient $\Gamma_{2open}$ (e.g., via implementation of Eq. 8) based on the single port measurement at port P1 while P2 is open.

In FIG. 3, where the output port P2 is shorted, $V_{2m}=-V_{2p}$. The shorting of the output port P2 can be achieved via electric coupling means, indicated schematically in dashed lines at 26 in FIG. 3. The coupling means 26 may be any suitable electrically conductive device or member for shorting the terminals at the output port P2. The means 26 could, for example, be a piece of metal foil or a wire (e.g., copper or aluminum) used to short the terminals of the output port P2.

When the output port P2 is shorted, the network analyzer 22 can measure $V_{1m}$ and $V_{1p}$ at the input port P1 via the probe 24. The S-parameter calculator 30 can determine the reflection coefficient $\Gamma_{2short}$ (e.g., via implementation of Eq. 18) based on the single port measurement at port P1 while P2 is shorted. The S-parameters of the DUT may then be determined through the implementation of Eqs. 10, 11, 12, and 20.

Figure 4:
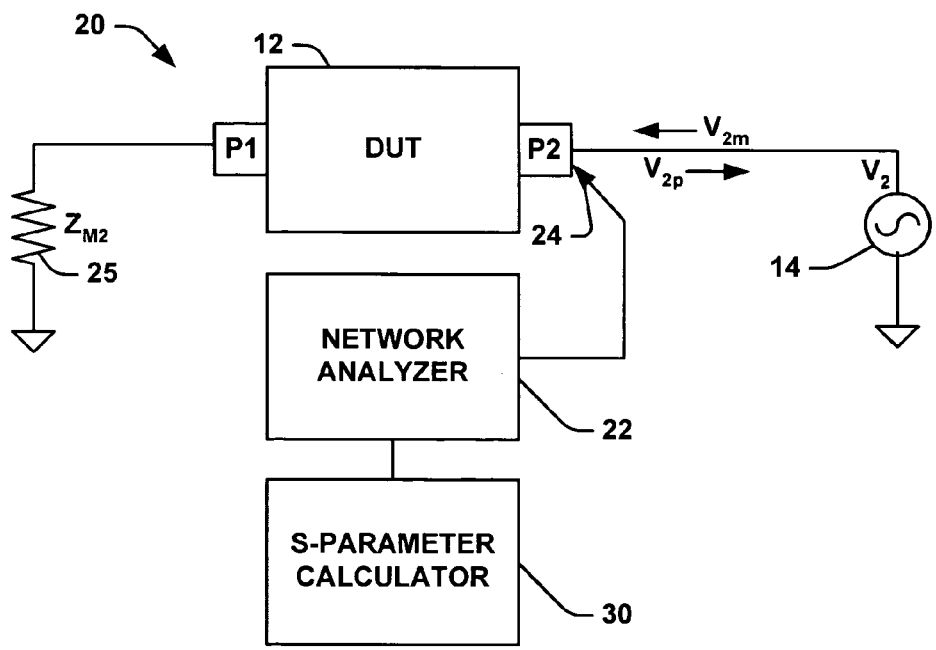
FIG. 4 depicts a simplified block diagram of the system of FIG. 2 in a third configuration for use in determining S-parameters of a network.

FIG. 4 illustrates another embodiment of a system 20 that can be used for determining the S-parameters of the DUT 12. In the example configuration of the system 20 shown in FIG. 4, the DUT 12 is operatively connected with the source 14, which supplies an input signal $V_2$ to the output port P2 of the DUT. A matched load 25 having an impedance indicated at $Z_{M2}$ is connected at the input port P1. The matched load $Z_{M2}$ has an impedance equal to the impedance of the DUT at the input port P1. The matched load $Z_{M2}$ can be the same as or different from the matched load $Z_{M1}$ for the input port P1, depending on the particular construction of the DUT 12. For example, if the impedance of the DUT at the input port P1 is 50 Ohms, the impedance of the matched load $Z_{M2}$ is also 50 Ohms. The network analyzer 22 is electrically connected with the output port P2 of the DUT 12 by the probe 24.

In the configuration of the system 20 shown in the example of FIG. 4, the matched load $Z_{M2}$ is applied to the input port P1. In this configuration, the network analyzer 22 can measure $V_{2m}$ and $V_{2p}$ at the output port P2 via the probe 24. The S-parameter calculator 30 can determine the reflection coefficient $\Gamma_{1match}$ (e.g., via implementation of Eq. 9) based on $V_{2m}$ and $V_{2p}$ determined from the single port measurement at port P2 while the matched load $Z_{M2}$ is applied to the output port P1.

Figure 5:
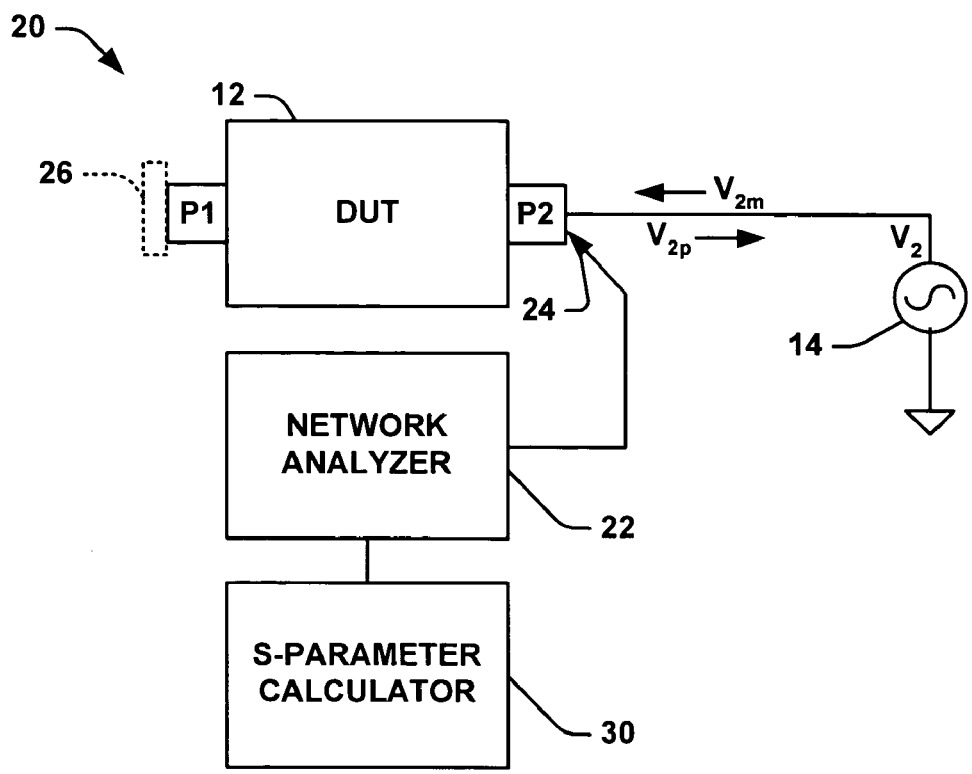
FIG. 5 depicts a simplified block diagram of the system of FIG. 2 in a fourth configuration for use in determining S-parameters of a network.

FIG. 5 depicts another configuration of the system 20 that can be utilized in determining S-parameters. In particular, FIG. 5 depicts a configuration in which measurements can be taken at port P2 while the input port P1 is open or shorted and an input signal $V_2$ is applied at P2. For the example where the input port P1 is open, it is can be shown that $V_{1m}=V_{1p}$. When the input port P1 is open, the network analyzer 22 can measure $V_{2m}$ and $V_{2p}$ at the output port P2 via the probe 24. The S-parameter calculator 30 can determine the reflection coefficient $\Gamma_{1open}$ based on the single port measurement at port P1 while P2 is open. For example, an equation similar to Eq. 8 may be derived to determine the reflection coefficient $\Gamma_{1open}$.

In FIG. 5, where the port P1 is shorted, $V_{1m}=-V_{1p}$. The shorting of the port P1 can be achieved via electric coupling means 26, such as described herein. When the input port P1 is shorted, the network analyzer 22 can measure $V_{2m}$ and $V_{2p}$ at the port P2 via the probe 24. The S-parameter calculator 30 can determine the reflection coefficient $\Gamma_{1short}$ based on the single port measurement at port P2 while P1 is shorted. For example, an equation similar to Eq. 18 may be derived to determine the reflection coefficient $\Gamma_{1short}$.

It is to be understood and appreciated that, since the reflection coefficients $\Gamma$ vary as a function of the waveform parameters, equations employed to define the S-parameters (e.g., Eqs. 10, 11, 12, and 20) could be rewritten in terms of the measured waveform parameters instead of reflection coefficients. As a result, the S-parameters could be determined directly as functions of the measured waveform parameters, without explicitly determining the reflection coefficients.

In view of the above embodiments of FIGS. 2–5, the present invention thus enables S-parameters to be determined through single port wave parameter measurements at the input port P1 and output port P2 of the DUT 12.

To this point, the present invention has been described mostly in terms of determining S-parameters of a two-port network. It will be appreciated, however, that the system and methodology of the present invention could be implemented to determine the S-parameters of a network having more than two ports. This is because, in a multi-port network where the forward and reverse gain S-parameters are equal, equations for determining the reflection coefficients and thus the S-parameters of the network may be determined. While the determination of such equations may involve complex algebraic and other mathematical operations, the equations are nonetheless ascertainable based on the teachings contained herein.

Additionally, the S-parameter calculator 30 can be programmed and/or configured to compute or otherwise determine the S-parameters $S_{11}$, $S_{12}$, $S_{21}$, and $S_{22}$ of the DUT 12 based on at least a subset of the single port measurements identified with respect to FIGS. 2–5. For instance, the S-parameter calculator 30 can employ Eqs. 9–12 to determine the S-parameters of the DUT using reflection coefficients $\Gamma_{1match}$, $\Gamma_{2open}$, and $\Gamma_{2match}$.

Figure 6:
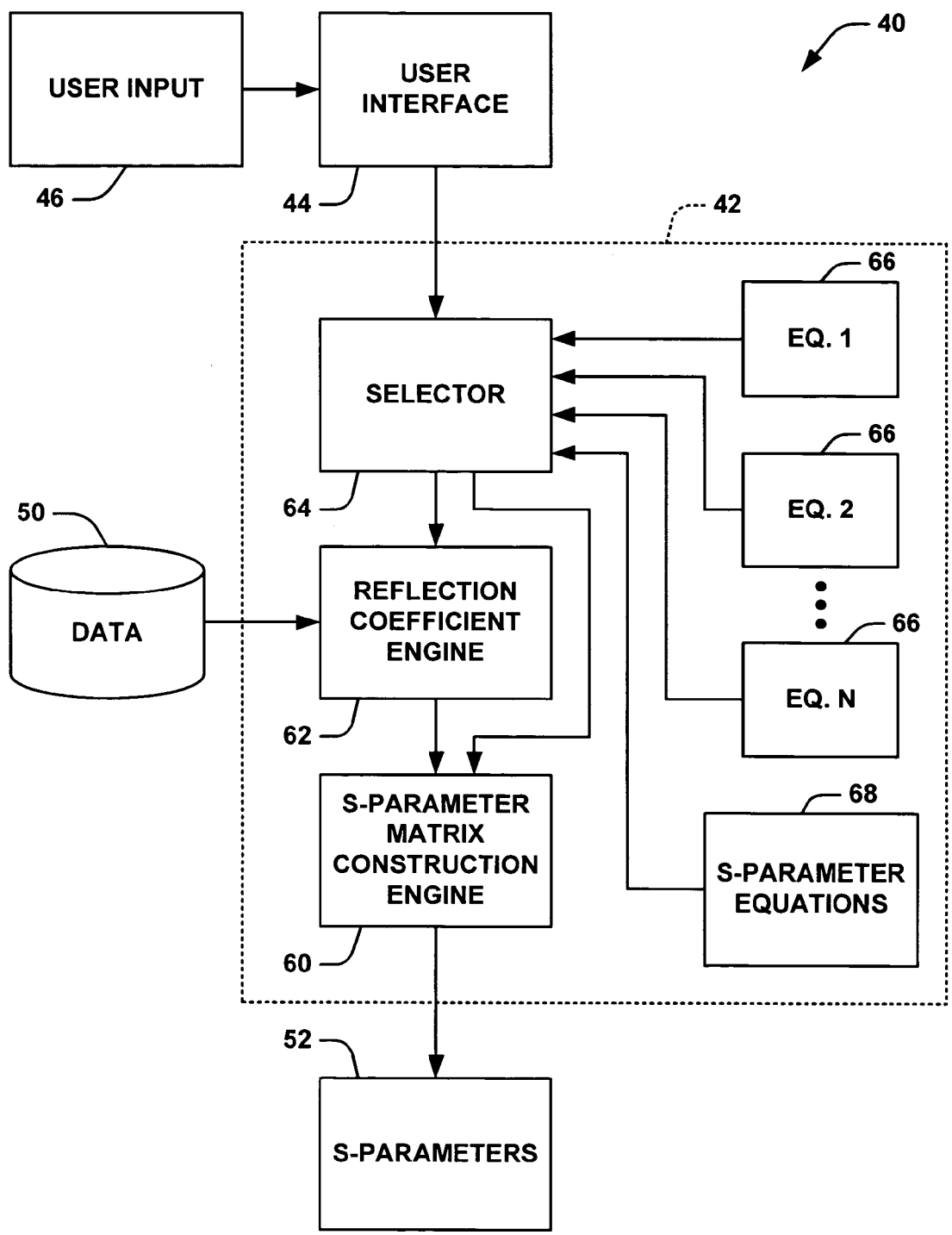
FIG. 6 depicts a simplified block diagram of a system for use in determining S-parameters of a network.

FIG. 6 illustrates another embodiment of a system 40 for determining S-parameters. The system 40 includes an S-parameter calculator 42 that implements an algorithm (e.g., equations) for determining reflection coefficients and S-parameters of a DUT. The S-parameter calculator 42 can be implemented as computer executable instructions, for example, running in a computer, workstation, network analyzer or other test equipment.

The system 40 can also include a user interface 44 associated with the S-parameter calculator 42, such as a graphical user interface (GUI). The user interface 44 provides a programmable mechanism to receive user inputs 46 for establishing operating parameters associated with the S-parameter calculator 42. For example, the user inputs 46 can define structural and/or functional characteristics associated with a DUT for which S-parameters are to be determined and the types of measurements employed to measure waveform parameters. The user inputs can also establish procedures for implementing verification of the S-parameter results.

The S-parameter calculator 42 is operatively connected to a source of data 50, which includes measurement information for a multi-port network. For example, the data 50 includes measurement data (e.g., measured waveform parameters) based on which reflection coefficients can be computed for the multi-port network. The data 50 can be stored in a computer-readable medium, such as a volatile storage device (e.g., RAM, DRAM etc.) or a non-volatile storage device (e.g., a hard disk drive, CD-ROM, etc.). The data can be provided in real time, such as by measurements implemented by a network analyzer or, alternatively, it can be stored for subsequent processing by the S-parameter calculator 42. The S-parameter calculator 42 is operative to construct an S-parameter matrix for the DUT and provide an indication of S-parameters, indicated as 52, based on the measurement data 50.

The S-parameter calculator 42 includes an S-parameter matrix construction engine 60 and a reflection coefficient engine 62. The S-parameter calculator 42 also includes a selector 64 for selecting parameters that define the operations to be performed by the reflection coefficient engine 62. The selector 64 may also select parameters that define the operation of the matrix construction engine 60. For instance, the selector 64 can select an appropriate set of equations 66 based on the user input 46 provided by to user interface 44. The selector 64, for example, may be operable to select from a set of available equations 66, such as those described above (e.g., Eqs. 2, 8, 9, and 18), for determining reflection coefficients of the DUT based on the data 50. Additionally or alternatively, the selector can select appropriate equations from an available set of equations 68 (e.g., Eqs. 10, 11, 12, and 20) for computing the S-parameters. For example, the equations 66 and 68 can be stored as a library of predetermined equations from which the selector 64 can access necessary equations based on the user inputs 46.

By way of further example, as shown in FIG. 6, the selector 64 may access a number of reflection coefficient equations (e.g., 1, 2, . . . N, where N denotes the number of equations) 66 to provide to the reflection coefficient engine 62. The number and type of reflection coefficient equations 66 provided to the reflection coefficient engine 62 may depend on a variety of factors. Such factors can include, for example, the types of measurements (e.g., configuration of the network) utilized to obtain waveform parameters, the number of ports of the DUT and/or the desired level of redundancy or verification that is to be performed in determining the S-parameters 52. For example, in regard to a two-port DUT, three of the possible four reflection coefficient equations will be sufficient to determine the four S-parameters. Such reflection coefficients can be determined based on three corresponding single port measurements on the DUT, such as described herein. The computations further simplify where at least one of the measurements are performed at one port while a matched load is applied at the other port.

A more conservative approach for a two-port network can employ four of reflection coefficient equations 66 to provide multiple sets of S-parameters, which can be correlated or compared to provide error checking and/or averaging. The equation selector 64 may also be operable to select other equations 68, such as those described above, for determining the S-parameters 52 based on the computed reflection coefficients. The matrix construction engine 60 thus computes the S-parameters based on applying the selected set of equations 66 and 68 to the measurement data 50.

Figure 8:
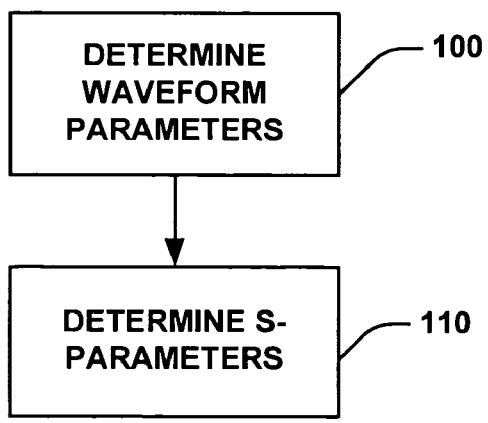
FIG. 8 depicts a flow diagram illustrating another method.
Figure 7:
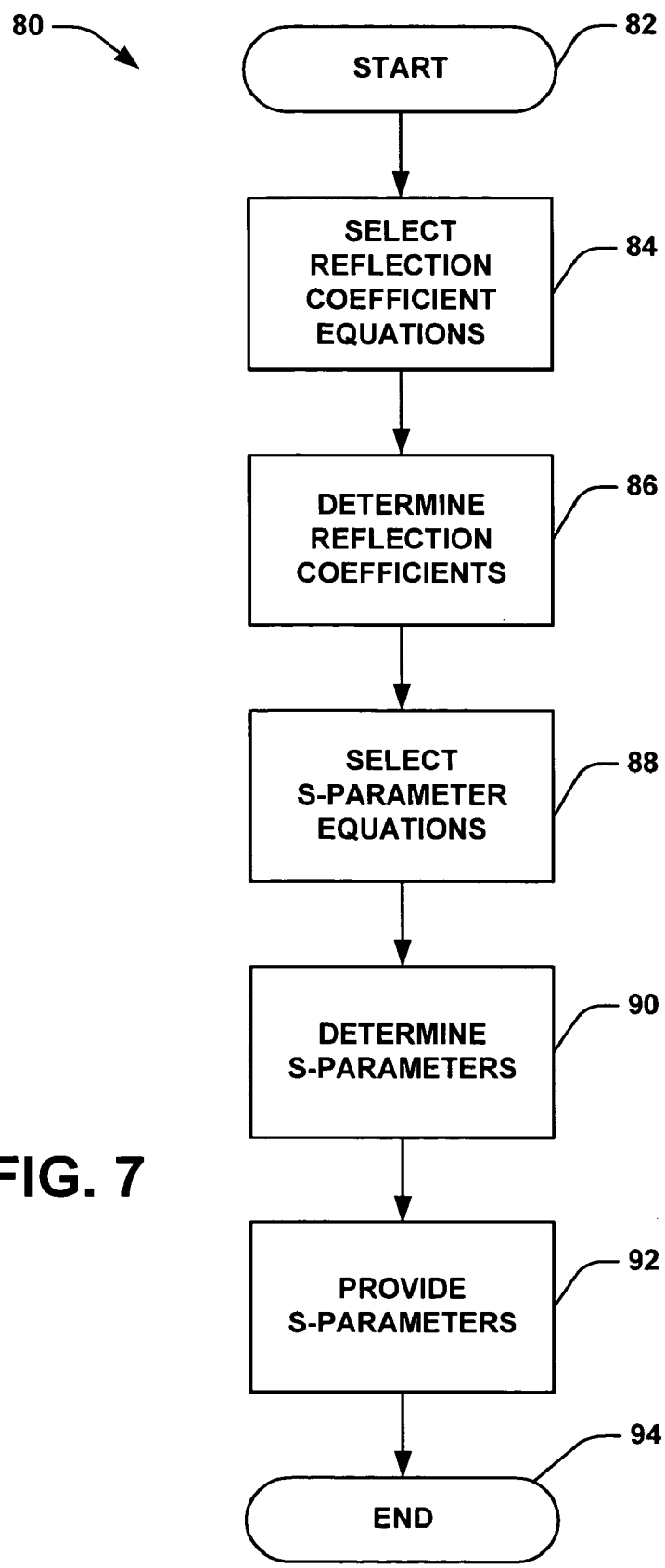
FIG. 7 depicts a flow diagram illustrating a methodology for determining S-parameters of a network.

In view of the foregoing structural and functional features described above, a methodology 80 for determining the S-parameters of a DUT will be better appreciated with reference to FIGS. 7 and 8. While, for purposes of simplicity of explanation, the methodology 80 of FIGS. 7 and 8 are shown and described as being implemented serially, it is to be understood and appreciated that the illustrated actions, in other embodiments, may occur in different orders and/or concurrently with other actions. Moreover, not all illustrated features may be required to implement a methodology. It is to be further understood that the methodology 80 can be implemented in hardware, software (e.g., as computer-executable instructions running in computer or test equipment), manually, or any combination thereof.

Referring to FIG. 7, the methodology 80 begins at 82. This can include defining attributes of a DUT (e.g., number of ports, the types and quantities of measurements, etc.). This can result in initializing variables to their starting values and instantiating objects in associated software. At 84, reflection coefficients equations are selected. For a two port network, for example, a full set of reflection coefficients can include $\Gamma_{1match}, \Gamma_{1open}, \Gamma_{1short}, \Gamma_{2match}, \Gamma_{2open}, \Gamma_{2short}$. The reflection coefficients are selected for use in the determination of the S-parameters of a DUT (e.g., the DUT 12 of FIG. 1). As described above, different numbers of reflection coefficient equations can be selected, depending on factors such as the number of ports of the DUT, the types of measurements performed to provide measurement data, and the desired level of averaging and/or verification of the computations. For example, in a two-port DUT, three equations for determining reflection coefficients can be used to determine the S-parameters of the DUT, without any verification or averaging. If verification or averaging of the S-parameters is desired for improved accuracy, an additional equation for determining a reflection coefficient may also be selected for the two-port example.

At 86, the reflection coefficients are determined based on the equations selected at 84 using the waveform parameters, such as described above. Alternatively, at 86, all or a selected number of reflection coefficients could be determined based on the waveform parameters available to the system without requiring selection. If, however, a subset of waveform parameters sufficient to determine only three reflection coefficients are available, then only three reflection coefficients may be determined at 86.

At 88, S-parameter equations are selected. The S-parameter equations enable S-parameters (e.g., $S_{11}, S_{12}, S_{21}, S_{22}$) of the DUT to be determined. As described above, the S-parameters may be determined through a variety of equations that incorporate different combinations of the reflection coefficients, such as determined at 86. Thus, the number of S-parameter equations selected may vary, depending on factors such as the number of ports of the DUT and the available reflection coefficients, as determined at 86.

At 90, the S-parameters are determined based on the equations selected at 88. Alternatively, the S-parameters could be determined at 90 without requiring selection of S-parameter equations at 88, such as accessing appropriate equations automatically based on the reflection coefficients available methodology 80. According to one embodiment, the S-parameters are determined at 90 based on data associated with a measurement at one port while employing a matched load at the other port(s). Using a matched load results in simplified equations, which mitigates the likelihood of errors propagating through the computations.

For example, in determining S-parameters for a two-port DUT, such as described above, a subset of some or all S-parameter equations can be utilized, which can vary according to the available reflection coefficients. As a result, where more reflection coefficients than needed are available, the S-parameters can be determined at 90 to provide redundant verification of the results and/or averaging. In a situation where a subset of less than all available reflection coefficients exists, fewer available S-parameter equations can still be utilized to ascertain the full S-parameter matrix. At 92, the S-parameters ($S_{11}$, $S_{12}$, $S_{21}$, $S_{22}$) determined from the equations implemented at 90 are provided. The S-parameters further can be provided at 92 after performing a comparison of the S-parameters that may have been computed based on different sets of reflection coefficients. This comparison can be utilized to provide an indication of the accuracy of the results. The methodology then ends at 94.

FIG. 8 depicts a method for determining S-parameters of a network. The method includes determining waveform parameters based on single port measurements performed at plural ports of the network, as shown at 100. At least one of the single port measurements corresponds to measurements at one of the plural ports while a matched load is applied to at least another of the plural ports. The method also includes determining S-parameters of the network based on the waveform parameters, as shown at 110.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for determining S-parameters of a network, comprising:
    an S-parameter calculator that computes the S-parameters of the network based on waveform parameters determined from single port measurements, at least one of the single port measurements corresponding to measurements at one of plural ports of the network while a matched load is applied to at least another of the plural ports, the S-parameter calculator computing the S-parameters of the network based on a number of single port measurements that is less than the number of S-parameters computed for the network.

2. The system of claim 1, the waveform parameters comprise information related to at least one of a transmission and a reflection of a signal provided at the single port.

3. The system of claim 1, the S-parameter calculator determines reflection coefficients based on the waveform parameters, the S-parameter calculator determining the S-parameters based on the reflection coefficients.

4. The system of claim 3, the reflection coefficients comprise values functionally related to a transmission and a reflection of a signal provided at the single port.

5. The system of claim 1, the network is a two-port network comprising first and second ports, the single port measurements comprising measurements implemented at three of:
    the first port while the second port has a matched load applied thereto;
    the first port while the second port is one of shorted and open;
    the second port while the first port has a matched load applied thereto; and
    the second port while the first port is one of shorted and open.

6. The system of claim 1, the S-parameter calculator determines reflection coefficients based on waveform parameters, the reflection coefficients comprising three of:
    a first reflection coefficient of a first port while each of the other plural ports has a matched load applied thereto;
    a second reflection coefficient of the first port while the other plural ports are one of shorted and open;
    a third reflection coefficient of a second port while each of the other plural ports has a matched load applied thereto; and
    a fourth reflection coefficient of the second port while the other plural ports are one of shorted and open.

7. The system of claim 1, the S-parameter calculator computes the S-parameters of the network based on a subset of less than all possible reflection coefficients for the network.

8. The system of claim 1, further comprising a network analyzer for performing the single port measurements.

9. The system of claim 1, the network is a passive multi-port network.

10. The system of claim 1, further comprising a reflection coefficient engine that determines a subset of $2n-1$ reflection coefficients associated with the plural ports, the subset of reflection coefficients being selected according to what types of measurements are performed at the plural ports, at least one of the types of measurements corresponding to a measurement at one of the plural ports while the matched load is employed at the at least another of the plural ports.

11. The system of claim 1, wherein at least one of the waveform parameters and a plurality of reflection coefficients are determined based on the single port measurements of the network, the S-parameter calculator computing the S-parameters of the network based on the at least one of waveform parameters and the plurality of reflection coefficients.

12. A system for determining S-parameters of an n-port network, n being a positive integer greater than one, the system comprising:
    a reflection coefficient engine that determines a subset of $2n-1$ reflection coefficients associated with ports of the n-port network, the subset of reflection coefficients being selected according to what types of measurements are performed at the ports of the n-port network, at least one of the types of measurements corresponding to a measurement at one of the n ports while a matched load is employed at at least another of the n ports; and
    an S-parameter calculator that computes the S-parameters for the n-port network based on the subset of $2n-1$ reflection coefficients.

13. The system of claim 12, the reflection coefficient engine provides the subset of reflection coefficients based on single port measurements performed at each of the ports of the n-port network, at least one of the single port measurements performed at one port while a load having an impedance matched to the impedance of the port to which it is applied.

14. The system of claim 13, n equals two, such that the n-port network includes first and second ports, the single port measurements comprising measurements implemented at three of:
    the first port while the second port has a matched load applied thereto;

the first port while the second port is one of shorted and open;

the second port while the first port has a matched load applied thereto; and the second port while the first port is one of shorted and open.

15. A system for determining S-parameters of a network, the system comprising:

means for determining at least one of waveform parameters and reflection coefficients based on single port measurements of the network, at least one of the single port measurements corresponding to measurements at one port while a matched load is applied to at least another port; and means for computing S-parameters of the network based on the at least one of waveform parameters and reflection coefficients, the number of S-parameters being greater than the number of single port measurements of the network.

16. The system of claim 15, further comprising means for performing single port measurements to enable a determination of the at least one of waveform parameters and reflection coefficients, the determining means computes the at least one of waveform parameters and reflection coefficients based on the single port measurements.

17. The system of claim 15, further comprising means for applying the matched load to the at least another port during measurements at the one port.

18. The system of claim 15, further comprising means for selecting a set of the single port measurements to be implemented by the determining means.

19. The system of claim 15, wherein the computing means comprises means for determining plural sets of the S-parameters for the network based on different respective sets of the reflection coefficients.

20. The system of claim 19, wherein the computing means comprises means for averaging determined S-parameters for at least some of the plural sets of S-parameters.

21. A method for determining S-parameters of a network comprising:

determining waveform parameters based on a number of single port measurements preformed at plural ports of the network, at least one of the single port measurements corresponding to measurements at one of the plural ports while a matched load is applied to at least another of the plural ports; and determining S-parameters of the network, the number of S-parameters determined being greater than the number of single port measurements.

22. The method of claim 21, the determination of S-parameters flirter comprises:

determining reflection coefficients based on the waveform parameters; and determining the S-parameters based on the reflection coefficients.

23. The method of claim 21, further comprising implementing single port measurements at each of the plural ports to provide the number of signal port measurements.

24. The method of claim 23, the network comprising a two-port network having first and second ports, the measurement of waveform parameters comprising three of:

applying a matched load at the second port while measuring waveform parameters at the first port;

measuring waveform parameters at the first port while the second port is one of open and shorted;

applying a matched load at the first port while measuring waveform parameters at the second port; and measuring waveform parameters at the second port while the first port is one of open and shorted.

25. The method of claim 21, the network comprising a two-port network having first and second ports, the determination of S-parameters further comprising three of:

determining a first reflection coefficient of the first port associated with a measurement at the first port while a matched load is applied at the second port;

determining a second reflection coefficient of the first port while the second port is one of open and shorted;

determining a third reflection coefficient of the second port associated with a measurement at the second port while a matched load is applied at the first port; and determining a fourth reflection coefficient of the second port while the first port is one of open and shorted.

26. The method of claim 21, the determination of S-parameters further comprising:

selecting equations for determining reflection coefficients;

implementing the selected equations to determine a subset of reflection coefficients for the network based on the waveform parameters; and determining the S-parameters based on the reflection coefficients.

27. The method of claim 21, the determination of S-parameters further comprising using different S-parameter equations to determine a plurality of values for the same S-parameter and averaging the plurality of values.

28. The method of claim 21, determination of S-parameters further comprising using different S-parameter equations to determine a plurality of values for the same S-parameter and comparing the values to facilitate verifying accuracy of the S-parameters.

29. A computer-readable medium having computer-executable instructions for performing a method comprising:

receiving waveform parameters based on a number of single port measurements performed at plural ports of the network, at least one of the single port measurements corresponding to measurements at one of the plural ports while a matched load is applied to at least another of the plural ports; and determining S-parameters of the network, the number of S-parameters determined being greater than the number of single port measurements.

30. A computer-readable medium having computer-executable instructions for performing a method comprising:

determining reflection coefficients based on a number of single port measurements performed at plural ports of the network, at least one of the single port measurements corresponding to measurements at one of the plural ports while a matched load is applied to at least another of the plural ports; and determining S-parameters of the network, the number of S-parameters determined being greater than the number of single port measurements.

* * * * *

UNITED STATES PATENT AND TRADEMARK OFFICE
CERTIFICATE OF CORRECTION

PATENT NO.        : 6,998,833 B2
APPLICATION NO.   : 10/701907
DATED             : February 14, 2006
INVENTOR(S)       : Yong Wang et al.

It is certified that error appears in the above-identified patent and that said Letters Patent is hereby corrected as shown below:

In column 3, lines 65-66, delete "$V_2$ m=$V_2$/2" and insert -- $V_{2m}=V_2/2$ --, therefor.

In column 5, line 22, delete "$S_{11}\Gamma=_{2match}$" and insert -- $S_{11} = \Gamma_{2match}$ --, therefor.

In column 13, line 42, in Claim 21, delete "preformed" and insert -- performed --, therefor.

In column 13, line 51, in Claim 22, delete "flirter" and insert -- further --, therefor.

In column 13, line 58, in Claim 23, delete "signal" and insert -- single --, therefor.

Signed and Sealed this

Twenty-first Day of April, 2009

JOHN DOLL
*Acting Director of the United States Patent and Trademark Office*